US010991817B2

(12) United States Patent
Dasgupta et al.

(10) Patent No.: US 10,991,817 B2
(45) Date of Patent: Apr. 27, 2021

(54) GROUP III-N TRANSISTORS INCLUDING SOURCE TO CHANNEL HETEROSTRUCTURE DESIGN

(71) Applicant: INTEL CORPORATION, Santa Clara, CA (US)

(72) Inventors: Sansaptak Dasgupta, Hillsboro, OR (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 128 days.

(21) Appl. No.: 16/304,966

(22) PCT Filed: Jul. 1, 2016

(86) PCT No.: PCT/US2016/040690
§ 371 (c)(1),
(2) Date: Nov. 27, 2018

(87) PCT Pub. No.: WO2018/004654
PCT Pub. Date: Jan. 4, 2018

(65) Prior Publication Data
US 2020/0119176 A1    Apr. 16, 2020

(51) Int. Cl.
*H01L 29/778*     (2006.01)
*H01L 21/02*      (2006.01)
(Continued)

(52) U.S. Cl.
CPC ...... *H01L 29/7786* (2013.01); *H01L 21/0254* (2013.01); *H01L 21/02381* (2013.01);
(Continued)

(58) Field of Classification Search
None
See application file for complete search history.

(56) References Cited

U.S. PATENT DOCUMENTS

2008/0203430 A1    8/2008  Simin et al.
2009/0072272 A1*   3/2009  Suh ............... H01L 29/7783
                                                      257/194

(Continued)

FOREIGN PATENT DOCUMENTS

WO        2018004654 A1    1/2018

OTHER PUBLICATIONS

International Search Report and Written Opinion received for PCT Application No. PCT/US2016/040690, dated Mar. 31, 2017. 10 pages.

(Continued)

*Primary Examiner* — Anthony Ho
*Assistant Examiner* — Kevin Quinto
(74) *Attorney, Agent, or Firm* — Schwabe, Williamson & Wyatt, P.C.

(57) ABSTRACT

Techniques are disclosed for forming group III-N transistors including a source to channel heterostructure design. As will be apparent in light of this disclosure, the source to channel heterostructure design may include inserting a relatively high bandgap material layer (e.g., relative to the bandgap of the channel material) between the source and channel of the III-N transistor. In some such embodiments, the relatively high bandgap material layer may be a portion of the polarization charge inducing layer formed over the III-N layer including the channel (e.g., to form a heterojunction/2DEG configuration) that is purposefully left in the source region when forming the source/drain trenches. The source to channel heterostructure design can be used to enhance the high frequency performance of the III-N transistor. Other embodiments may be described and/or disclosed.

20 Claims, 9 Drawing Sheets

(51) Int. Cl.
*H01L 21/306* (2006.01)
*H01L 29/06* (2006.01)
*H01L 29/08* (2006.01)
*H01L 29/20* (2006.01)
*H01L 29/205* (2006.01)
*H01L 29/417* (2006.01)
*H01L 29/423* (2006.01)
*H01L 29/66* (2006.01)

(52) U.S. Cl.
CPC .... *H01L 21/30612* (2013.01); *H01L 29/0653* (2013.01); *H01L 29/0847* (2013.01); *H01L 29/2003* (2013.01); *H01L 29/205* (2013.01); *H01L 29/41775* (2013.01); *H01L 29/4236* (2013.01); *H01L 29/42376* (2013.01); *H01L 29/66462* (2013.01)

(56) References Cited

U.S. PATENT DOCUMENTS

| | | | |
|---|---|---|---|
| 2010/0084688 A1 | 4/2010 | Lu et al. | |
| 2013/0126889 A1 | 5/2013 | Bahl | |
| 2013/0141156 A1 | 6/2013 | Teo et al. | |
| 2013/0313561 A1* | 11/2013 | Suh | H01L 29/402 257/76 |
| 2015/0028346 A1* | 1/2015 | Palacios | H01L 29/66462 257/76 |
| 2015/0221727 A1 | 8/2015 | Kub et al. | |
| 2016/0343801 A1* | 11/2016 | Pilla | H01L 29/0878 |

OTHER PUBLICATIONS

International Preliminary Report on Patentability received for PCT Application No. PCT/US2016/040690, dated Jan. 10, 2019. 7 pages.

* cited by examiner

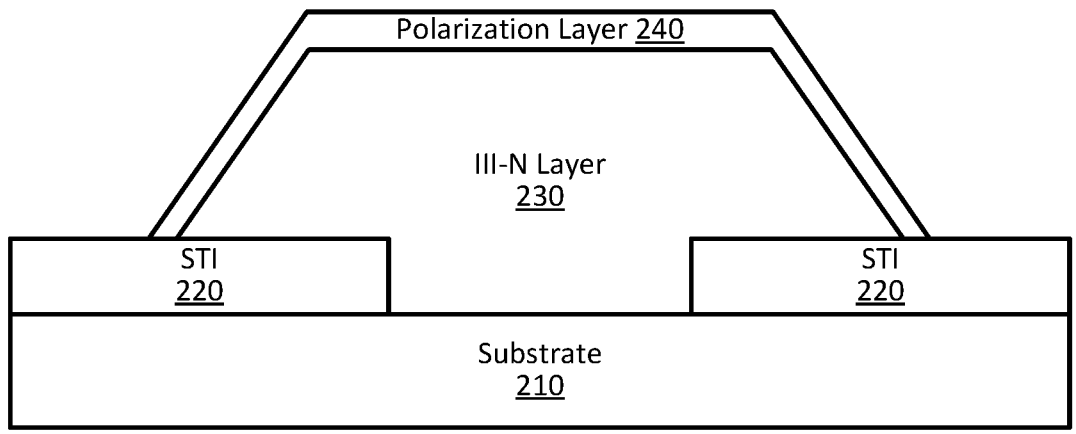
FIG. 2A
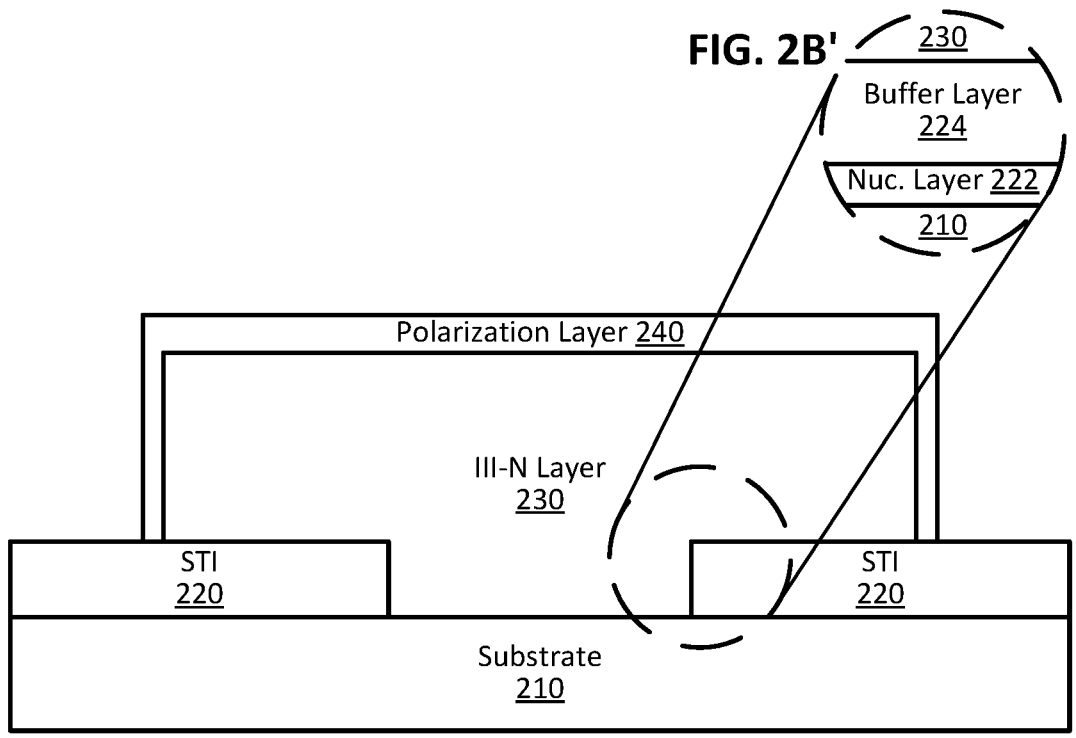
FIG. 2B
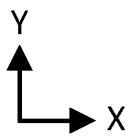

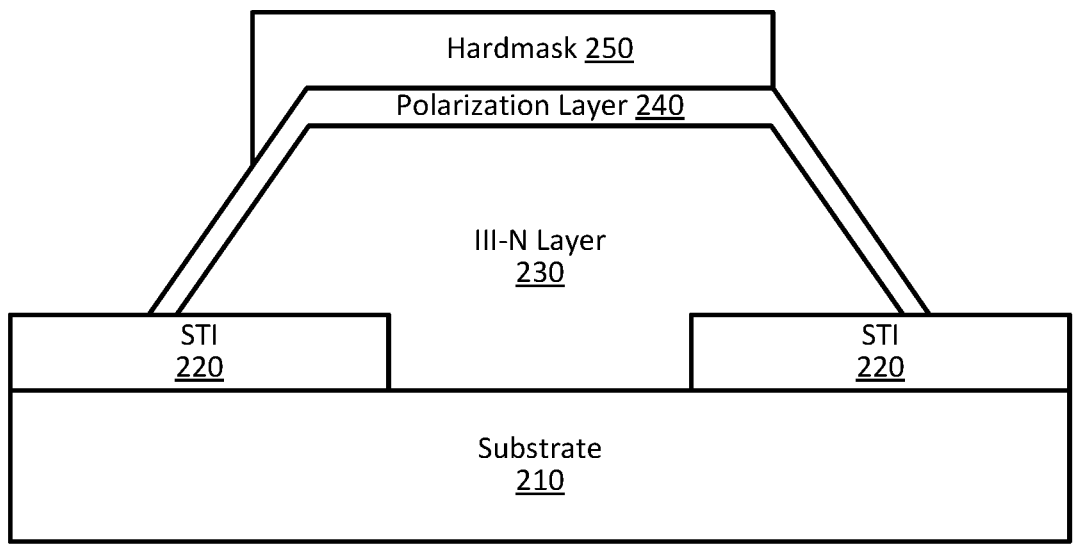
FIG. 3A
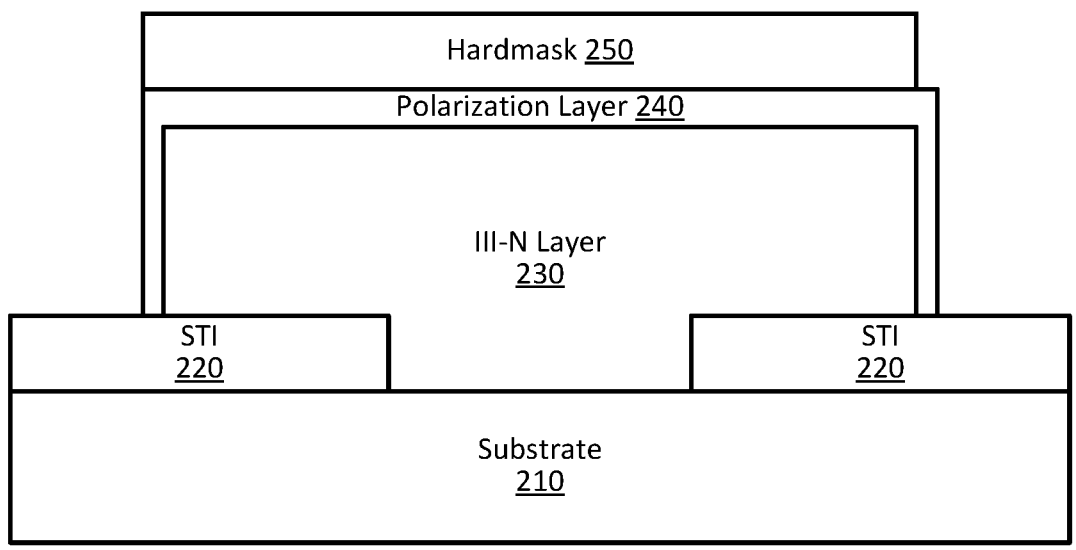
FIG. 3B
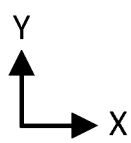

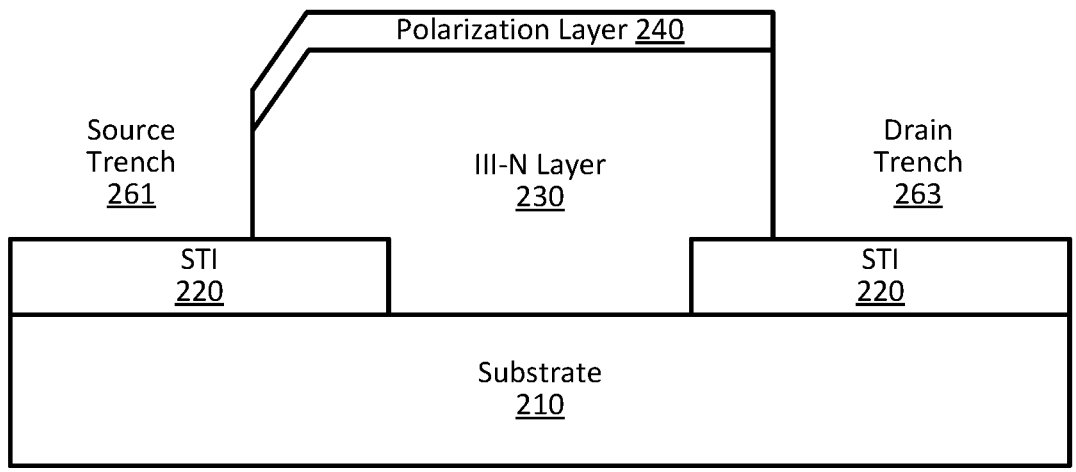
FIG. 4A
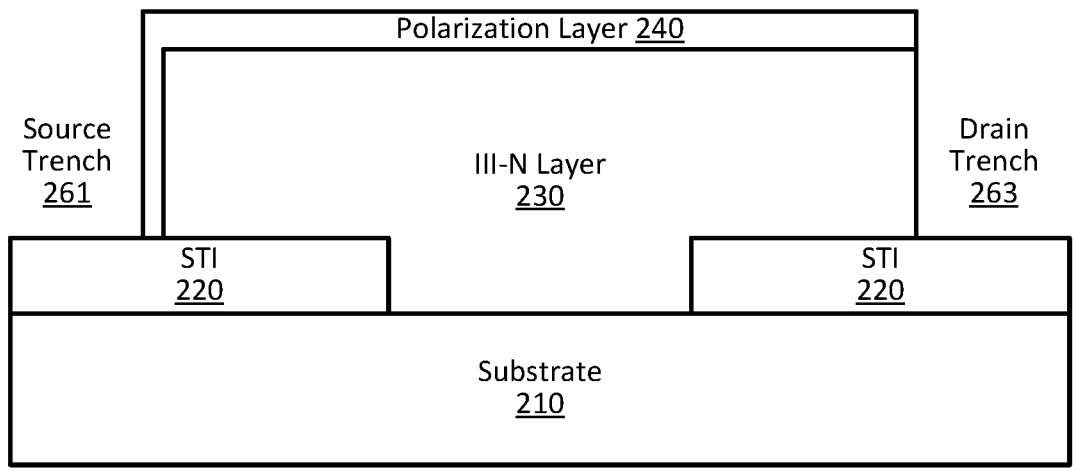
FIG. 4B
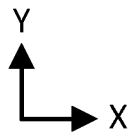

GROUP III-N TRANSISTORS INCLUDING SOURCE TO CHANNEL HETEROSTRUCTURE DESIGN

CROSS-REFERENCE TO RELATED APPLICATIONS

This patent application is a U.S. National Phase Application under 35 U.S.C. § 371 of International Application No. PCT/US2016/040690, filed on Jul. 1, 2016, the entire contents of which is hereby incorporated by reference herein.

BACKGROUND

In the fields of wireless communication and power management, various components can be implemented using solid-state devices. For example, in radio frequency (RF) communication, the RF front-end is a generic term for the circuitry between an antenna and a digital baseband system. The RF front-end may include multiple components, such as power amplifiers, low-noise amplifiers, and voltage regulators. Such RF front-end components may include one or more transistors, such as one or more field-effect transistors (FETs). A FET is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called, the body or substrate, which can be used to bias the transistor. In addition, for FETs, there are two major operation types known as depletion mode (D-mode) and enhancement mode (E-mode). D-mode transistors operate with zero (or near zero) gate-source voltage when the transistor is in an on-state, for example. E-mode transistors operate with zero (or near zero) gate-source voltage when the transistor is in an off-state, for example.

A metal-oxide-semiconductor FET (MOSFET) is configured with an insulator between the gate and the body of the transistor, and MOSFETs are commonly used for amplifying or switching electronic signals. In some cases, MOSFETs include sidewall spacers (or so-called gate spacers) on either side of the gate that can help determine the channel length and can help with replacement gate processes, for example. Other transistor configurations are available, such as a heterostructure FET (HFET) or high-electron-mobility transistor (HEMT), which is a FET incorporating a junction between two materials with different band gaps as the channel instead of an impurity doped region (as is generally the case for typical MOSFETs). A MOSHEMT (or MOSHFET) includes attributes of both a MOSFET and a HEMT (or HFET), such as including a heterojunction channel and a gate dielectric, for example. Complementary MOS (CMOS) structures use a combination of a p-channel transistor (e.g., a PMOS) and an n-channel transistor (e.g., an NMOS) to implement logic gates and other digital circuits.

BRIEF DESCRIPTION OF THE DRAWINGS

FIGS. 2A-B, 3A-B, 4A-B, 5A-B, and 6A-B illustrate example IC structures formed when carrying out the method of FIG. 1, in accordance with some embodiments of the present disclosure. Note that FIGS. 2A, 3A, 4A, 5A, and 6A may be referred to herein as FIGS. 2-6A, as those figures illustrate example IC structures including III-N layers originally formed with a generally trapezoidal shape. Also note that FIGS. 2B, 3B, 4B, 5B, and 6B may be referred to herein as FIGS. 2-6B, as those figures illustrate example IC structures including III-N layers originally formed with a generally rectangular shape.

Figure 1:
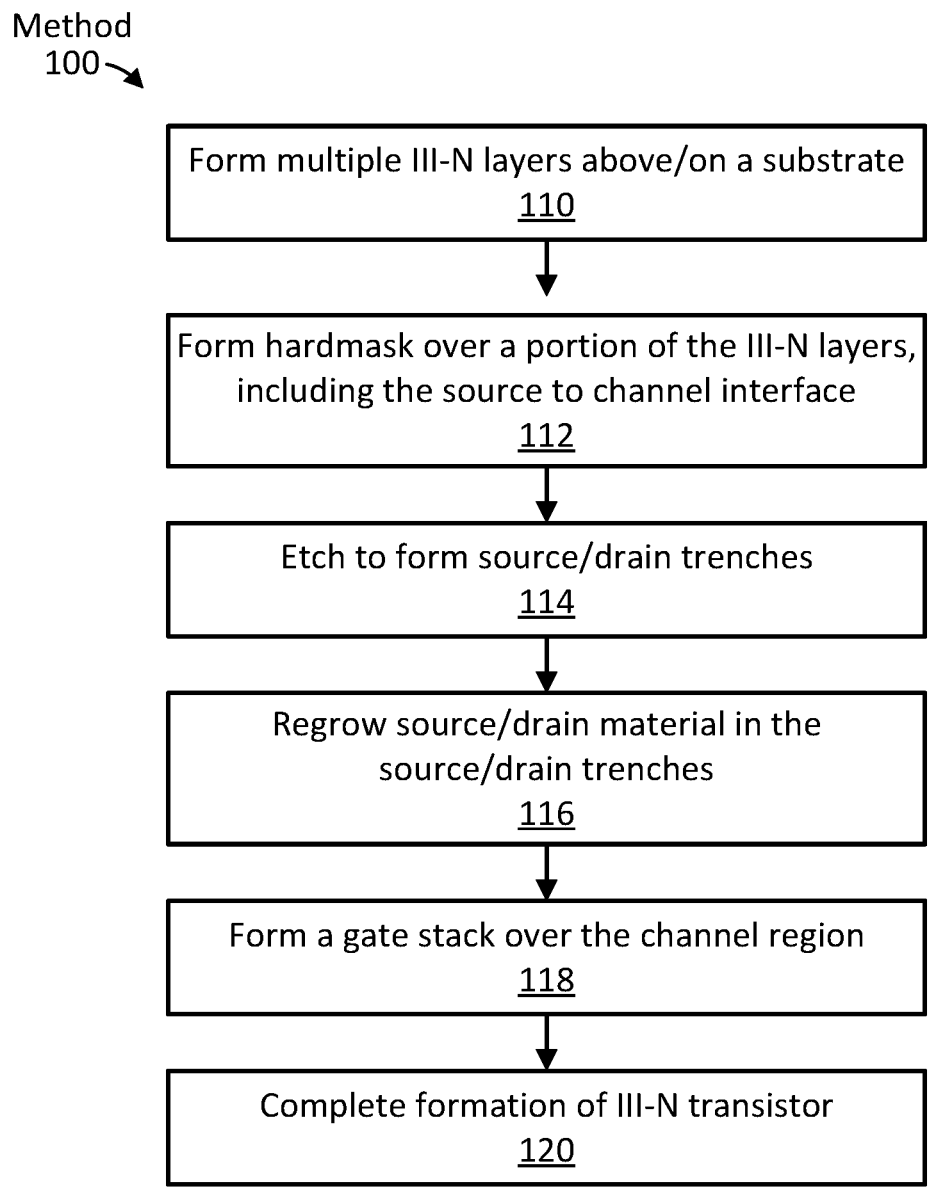
FIG. 1 illustrates an example method of forming an integrated circuit (IC) including a group III-nitride (III-N) transistor having a source to channel heterostructure design, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

As previously described, transistors are used in multiple RF front end components, such as RFPAs and LNAs. For high frequency applications, transistor parasitic capacitance and transistor on-state resistance need to be minimized. However, minimizing both issues becomes more and more challenging as transistor dimensions are scaled to achieve high frequency operation. High frequency III-N enhancement-mode (E-mode) transistors may rely on, for example, the reduction of gate length and the improvement of parasitics (e.g., gate over-hang capacitance and contact resistance) to increase high frequency performance, such as to improve the cut-off frequency (fT) and maximum oscillation frequency (fMAX) of the transistors. However, reductions of source-to-gate and drain-to-gate distances come at the penalty of a larger overlap capacitance which acts as a critical parasitic component that degrades the fT and fMAX of the devices. Further, transistors can only be scaled down so far, and once that reaches a practical limit, fT and fMAX cannot be improved by reducing the transistor gate length.

Thus and in accordance with one or more embodiments of this disclosure, techniques are provided for forming group III-N transistors including a source to channel heterostructure design. As will be apparent in light of this disclosure, in some embodiments, the source to channel heterostructure design may include inserting a relatively high bandgap material layer (e.g., relative to the bandgap of the channel material) between the source and channel of the III-N transistor. In some such embodiments, the relatively high bandgap material layer may be a portion of the polarization charge inducing layer formed over the III-N layer including the channel (e.g., to form a heterojunction and 2DEG configuration) that is purposefully left in the source region when forming the source/drain trenches. Leaving a portion of that polarization charge inducing layer in the source region would be atypical, as the polarization layer is typically completely removed from both of the source/drain regions when forming the source/drain trenches, as will be explained in more detail herein. Further, forming a heterostructure design between the source and channel regions, as variously described herein, is atypical, as such a design can increase resistance at the source to channel interface, which would otherwise be undesired outside of the rationales that can be understood based on this disclosure. As used herein, group III-N material (or III-N material or III-N) includes a compound of one or more group III elements (e.g., aluminum, gallium, indium, boron, thallium), with nitrogen.

Accordingly, material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN).

Figure 8:
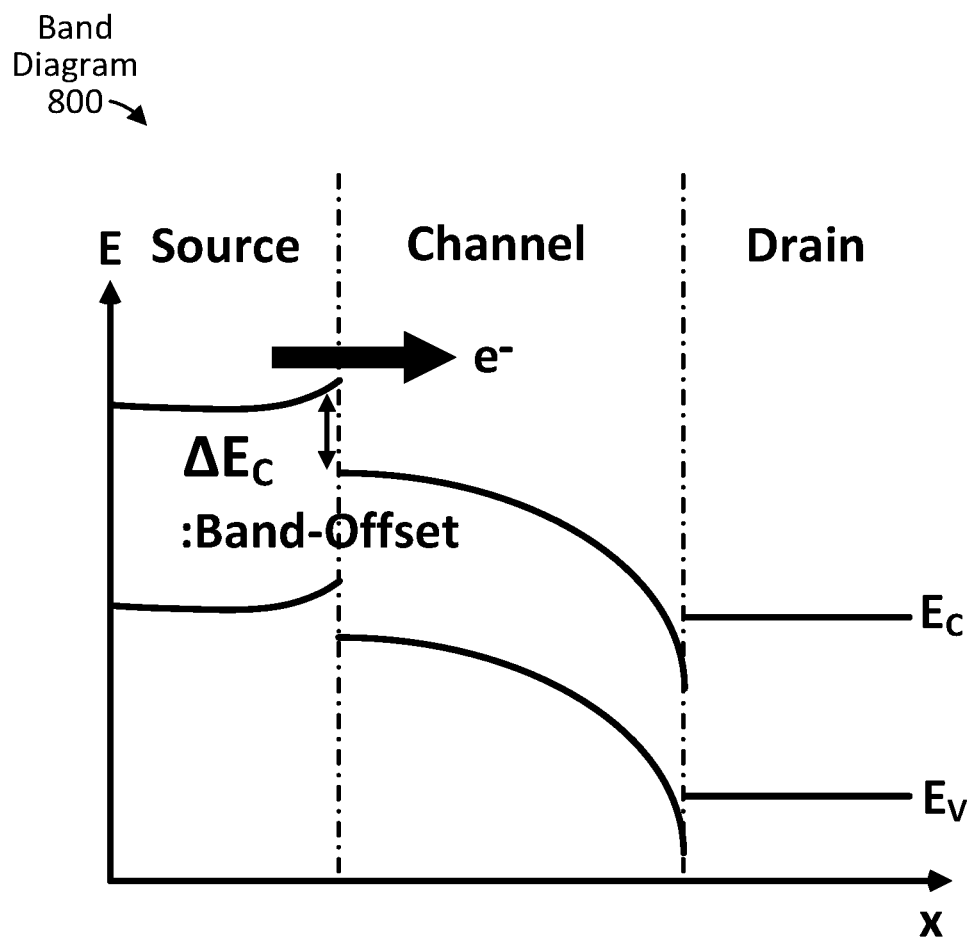
FIG. 8 illustrates an example band diagram for a III-N transistor including a source to channel heterostructure design, in accordance with an embodiment of the present disclosure.

In some embodiments, the source to channel heterostructure design enables electrons to have high-injection velocities from the source into the channel. In other words, by using heterostructure band engineering, a notch in the conduction band can be engineered between the source and the channel of a III-N transistor. For instance, in the example band diagram 800 in FIG. 8, the Y-axis represents energy level (E) and the X-axis represents position (x). As shown, going from left to right on the X-axis, representative conduction band edge (Ec) and valence band edge (Ev) energy levels are respectively provided for the source, channel, and drain regions of a transistor including a source to channel heterostructure design. As is also shown, the notch in the conduction band edge is indicated as delta Ec. The notch of delta Ec (which may also be referred to as a band offset) results in electrons being injected over a barrier due to thermionic emission with relatively higher velocity than if the source to channel heterostructure was not used. This occurrence is illustrated by a rightward facing arrow with an electron symbol (e−) in FIG. 8, showing the electron movement from the source region to the channel region. In some instances, the high-velocity electrons may be called hot electrons and their velocity may be approximately proportional to the increase in delta Ec, for example. Once the hot electrons enter the channel region, they are swept down by the drain field with the high velocity. An indicator of transistor performance for high-frequency applications—the unity current gain cut-off frequency (fT)—can be alternatively expressed as $\frac{1}{2}pi*t$, where t is the time it takes for the electron to transit the channel. By injecting electrons with high velocity into the channel, the transit time is reduced and thus a relatively higher fT (and fMAX) can be achieved. In other words, the source to channel heterostructure design can increase the high frequency performance of the transistor, as the high electron velocity enables a lower transit time and hence a faster frequency performance, for example. Therefore, in some embodiments, the techniques described herein can enable III-N transistors to operate at relatively improved fT, such as greater than 300, 350, 400, or 450 GHz fT, for example.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate a III-N transistor including a source to channel heterostructure design, as variously described herein. In some such embodiments, the heterostructure design may include forming a layer between the source and channel of the III-N transistor, where the layer includes material having a higher or larger bandgap relative to the material of the channel, for example. Further, in some such embodiments, that layer may be a portion of one or more of the polarization charge inducing layer(s) used to help form a two-dimensional electron gas (2DEG) configuration with the material layer in which the channel is located. In some embodiments, the techniques and structure described herein may be used for system-on-chip (SoC) applications, such as for the co-integration of high performance voltage regulator (VR) circuits and RF front-end circuitry with group IV (e.g., Si, Ge, SiGe)-based CMOS devices/processing, such as forming the devices on a common Si substrate or wafer, for example. Numerous configurations and variations will be apparent in light of this disclosure.

Methodology and Architecture FIG. 1 illustrates an example method 100 of forming an integrated circuit (IC) including a group III-nitride (III-N) transistor having a source to channel heterostructure design, in accordance with some embodiments of the present disclosure. FIGS. 2A-B, 3A-B, 4A-B, 5A-B, and 6A-B illustrate example IC structures formed when carrying out method 100 of FIG. 1, in accordance with some embodiments. Note that FIGS. 2A, 3A, 4A, 5A, and 6A may be referred to herein as FIGS. 2-6A, as those figures illustrate example IC structures including III-N layers originally formed with a generally trapezoidal shape. Also note that FIGS. 2B, 3B, 4B, 5B, and 6B may be referred to herein as FIGS. 2-6B, as those figures illustrate example IC structures including III-N layers originally formed with a generally rectangular shape. Further note that the example IC structures of FIGS. 2-6A and 2-6B are cross-sectional views taken along an orthogonal-to-gate direction, as will be apparent in light of this disclosure. Method 100 and the structures of FIGS. 2-6A and 2-6B are provided as examples to help illustrate techniques for forming a III-N transistor including a source to channel heterostructure design and are not intended to limit the present disclosure to any particular method or structure, unless otherwise stated.

The III-N transistors in the present disclosure are primarily described and depicted in the context of metal-oxide-semiconductor high-electron mobility transistors (MOSHEMTs) or MOS heterostructure field-effect transistors (MOSHFETs); however, the present disclosure is not intended to be so limited. Further the transistors in the present disclosure are primarily described and depicted in the context of planar transistor configurations. However, in some embodiments, the techniques can be used to form transistors including a non-planar configuration, such as finned or finFET configurations (e.g., including a dual-gate or tri-gate configuration) or gate-all-around configurations (e.g., including one or more nanowires or nanoribbons), as can be understood based on this disclosure. In some embodiments, the techniques may be used to benefit devices of varying scales, such as transistor devices having critical dimensions in the micrometer range and/or in the nanometer range (e.g., transistors formed at the 32, 22, 14, 10, 7, or 5 nm process nodes, or beyond).

Method 100 of FIG. 1 includes forming 110 multiple III-N layers on a substrate to form the example structures of FIGS. 2A and 2B, in accordance with an embodiment. III-N layers, as used herein, are IC layers that include III-N material, which may or may not include other material as well (e.g., n-type impurity dopant material). As previously described, group III-N material (or III-N material or III-N) includes a compound of one or more group III elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN). As shown in FIGS. 2A and 2B, the structures include substrate 210, shallow trench isolation (STI) layer 220, III-N layer 230, and polarization layer 240. The III-N layers that were formed 110 include III-N layer 230 and polarization layer 240, in these example embodiments. Prior to forming 110 the III-N layers, STI layer 220 was formed to assist the formation of III-N layer 230, as will be described in more detail herein. The layers of the example structures of FIGS. 2A-2B will be described in turn, along with numerous variations and configurations, as will be apparent in light of this disclosure.

Substrate 210, in some embodiments, may include: a bulk substrate including a group IV material, such as silicon (Si), germanium (Ge), silicon germanium (SiGe), or silicon carbide (SiC), and/or at least one group III-V material and/or sapphire and/or any other suitable material(s) as will be apparent in light of this disclosure; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium arsenide (GaAs), gallium nitride (GaN), indium gallium arsenide (InGaAs), and indium gallium nitride (InGaN), to name some examples. In some embodiments, substrate 210 may or may not be doped with one or more materials, such as p-type or n-type impurity doping of any suitable concentration, for example. In some embodiments, substrate 210 may include a surface crystalline orientation described by a Miller Index of <100>, <110>, or <111>, or its equivalents, as will be apparent in light of this disclosure. For instance, in an example embodiment, substrate 210 may be an n-type doped Si substrate having a <100> surface orientation with a miscut or offcut of 2-10 degrees in the <110> direction. Although substrate 210, in this example embodiment, is shown as having a thickness (the dimension in the Y direction) similar to the other layers for ease of illustration, in some instances, substrate 210 may be much thicker than the other layers, such as having a thickness in the range of 50 to 950 microns, for example. In some embodiments, substrate 210 may be used for one or more other IC devices, such as various diodes (e.g., light-emitting diodes (LEDs) or laser diodes), various transistors (e.g., MOSFETs and/or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the structures described herein may be included in a system-on-chip (SoC) application, as will be apparent in light of this disclosure.

III-N layer 230, in some embodiments, may include any suitable III-N material, such as GaN or InGaN, or any other suitable group III-N semiconductor material, as will be apparent in light of this disclosure. In some embodiments, III-N layer 230 may formed using any suitable techniques, such as depositing/growing the layer material using, for example, metal-organic chemical vapor deposition (MOCVD), molecular-beam epitaxy (MBE), chemical vapor deposition (CVD), atomic layer deposition (ALD), physical vapor deposition (PVD), and/or any other suitable process as will be apparent in light of this disclosure. As can be understood based on this disclosure, the channel or channel region of the resulting III-N transistors formed using the techniques described herein is located in III-N layer 230, in accordance with some embodiments. In some embodiments, GaN may be particularly well-suited for III-N layer 230 because of its wide or large bandgap, high critical breakdown electric field, and high electron saturation, for example. For instance, embodiments employing GaN for the III-N layer 230 may be particularly well-suited for high-voltage and high-frequency applications, such as in the context of RF power amplifiers and low-noise amplifiers, to name some example devices. In some embodiments, III-N layer 230 may have a multilayer structure including multiple III-N materials. In some embodiments, III-N layer 230 may or may not include grading (e.g., increasing and/or decreasing) the content of one or more materials in at least a portion of the layer. In some embodiments, III-N layer 230 may or may not be doped with another material, such as with one or more suitable p-type or n-type dopants, for example. For instance, in some embodiments, III-N layer 230 may not include any impurity dopants and thus be intrinsic. In some embodiments, III-N layer 230 may be formed to have a thickness (the dimension in the Y direction) between 20 nm and 2 microns, or any other suitable thickness, as will be apparent in light of this disclosure. Note that the thickness of the III-N layer 230 may be measured as the thickness above substrate 210 or the thickness above STI features 220, for example.

In the example structures of FIGS. 2A and 2B, III-N layer 230 is formed using lateral epitaxial overgrowth (LEO) processing. Such LEO processing may include, for example, forming and patterning shallow trench isolation (STI) layer on substrate 210 to form individual STI features 220 as shown and then growing the III-N layer 230 material on substrate 210 and from the opening(s) between the STI features 220, such that defects that may be present bend or otherwise form over the STI features 220, leaving at least an upper portion of the III-N layer 230 material suitable for use as a transistor channel. Such defects may be present due to the growth of the III-N layer 230 material (e.g., GaN) on the substrate 210 material (e.g., Si). In such embodiments, STI 220 may include any suitable material, such as any suitable dielectric, oxide (e.g., silicon dioxide), and/or suitable nitride (e.g., silicon nitride), to name a few examples. Note that although III-N layer 230 is shown growing out of only one trench opening between STI layer 220, in some embodiments, the III-N layer 230 may be grown out of multiple such trenches and in such embodiments, the III-N material may grow together depending on the position of the trenches and the growth conditions, for example. Therefore, in some such embodiments, there may be one or more STI islands below the III-N layer 230, as can be understood based on this disclosure.

FIG. 2B' is a blown-out view of a portion of the structure of FIG. 2B, illustrating an example alternative structure for the portion, in accordance with an embodiment of the present disclosure. In the example structure of FIG. 2B', III-N layer 230 is formed using buffer layer 224. In this example embodiment, buffer layer 224 may be used to assist with the formation of III-N layer 230 such that layer 230 can achieve a sufficient or otherwise desired device quality. As such, buffer layer 224 may include any suitable III-N material. For instance, in the case where III-N layer 230 includes GaN and substrate 210 includes Si, buffer layer 224 may include AlGaN or InGaN to assist with ensuring the GaN layer (to be used for the channel material) is of a sufficient or otherwise device quality, for example. In some embodiments, buffer layer 224 may have any suitable thickness (the dimension in the Y direction) such as between 50 nm and 5 microns, or any other suitable thickness, as will be apparent in light of this disclosure. In some embodiments, an optional nucleation layer (shown in FIG. 2B' as layer 222) may be present to improve growth conditions and/or prevent the III-N layer 230 from reacting with the substrate material in an undesired manner, for example. In some such embodiments, the nucleation layer, where present, may include III-V or III-N material, such as AlN or a low temperature GaN layer (e.g., epitaxially grown at a temperature in the range of 700 to 950 degrees C.), for example. In some embodiments, nucleation layer 222 (where present) may have any suitable thickness (dimension in the Y direction), such as a thickness of 10 nm to 2 microns (e.g., 200 nm to 1 micron), or any other suitable thickness as will be apparent in light of this disclosure.

Polarization charge inducing layer 240 (which may be referred to herein as simply polarization layer for ease of reference), in some embodiments, may be formed using any suitable techniques, such as depositing/growing the layer material using any of the aforementioned processes (e.g., MOCVD, MBE, CVD, ALD, PVD), and/or any other suitable process as will be apparent in light of this disclosure. In some embodiments, polarization layer 240 may only (or substantially) grow on or otherwise effectively stick to the III-N layer 230 material, for example. In some embodiments, polarization charge inducing layer 240 may include any suitable materials, such as one or more III-N materials, for example. In some embodiments, polarization charge inducing layer 240 may include aluminum, such that the layer includes at least one of AlN, AlGaN, InAlN, and InAlGaN, for instance. In some such embodiments, polarization layer 240 may include material having a higher (or larger) bandgap (or energy gap) than the material of III-N layer 230 to, for example, form a two-dimensional electron gas (2DEG) configuration in the III-N layer 230 near the interface between layers 230 and 240. In some embodiments, polarization charge inducing layer 240 may be intrinsic or include impurity doping, such as n-type or p-type doping, for example. In some embodiments, polarization charge inducing layer 240 may be used as an intermediary layer between the channel and the gate stack and/or to form two-dimensional electron gas (2DEG) access regions to the left and right of the transistor channel, as will be described in more detail herein with reference to FIGS. 6A-B and 7A-B. In some embodiments, polarization charge inducing layer 240 may have a multilayer structure including multiple III-N layers, such as is the case in FIGS. 7A-B, described in more detail below. In some such embodiments, where the polarization layer 240 is a multilayer structure, one of the layers in the multilayer structure may be present to further increase carrier mobility in the transistor channel region and/or to improve compatibility (e.g., density of interface traps) of the layers in the transistor structure, for example. In some embodiments, polarization charge inducing layer 240 may or may not include grading (e.g., increasing and/or decreasing) the content of one or more materials in at least a portion of the layer. In some embodiments, polarization charge inducing layer 240 may have one or more thicknesses, as will be described in more detail with respect to FIGS. 6A-B.

Method 100 of FIG. 1 continues with forming 112 hardmask 250 over a portion of the III-N layers 230 and 240 in the structures of FIGS. 2A and 2B, including what will be the source to channel interface, to form the example structures of FIGS. 3A and 3B, respectively, in accordance with some embodiments. In some embodiments, hardmask 250 may include any suitable material, such as a dielectric material, for example. In some embodiments, hardmask 250 may be formed 112 using any suitable techniques, such as depositing the hardmask layer 250 using any of the aforementioned processes (e.g., MBE, CVD, ALD, PVD), sputter depositing the material, and/or using any other suitable processes as will be apparent in light of this disclosure. Hardmask 250 may be formed just in the areas shown on the example structures of FIGS. 3A and 3B, or it may be first blanket deposited and then patterned to form the hardmask 250 features shown, for example. As shown in FIGS. 3A and 3B, hardmask 250 is not symmetrically formed on polarization layer 240 and over III-N layer 230, in these example embodiments. This is because the hardmask is covering at least a portion of the polarization layer 240 (or polarization layers, in the case of a multilayer structure) that will be in the location between the source region and channel of the final transistor structure, in these example embodiments. As the source region will be formed on the left side of the structures shown, hardmask 250 extends farther on the left side of the III-N layers 230, 240 than the right side, as shown in these example embodiments. As will be apparent in light of this disclosure, this asymmetrical hardmask 250 formation is an example technique for forming a III-N transistor including a source to channel heterostructure design.

Method 100 of FIG. 1 continues with etching 114 the structures of FIGS. 3A and 3B to form source/drain trenches 261, 263 as shown in the example structures of FIGS. 4A and 4B, respectively, in accordance with some embodiments. In some embodiments, etch process 114 may include any suitable wet and/or dry etch process(es), for example. As shown in FIGS. 4A and 4B, the etch process 114 forms source trenches 261 on the left sides of the example structures and drain trenches 263 on the right sides of the structures. Note that in the example embodiment of FIG. 4B, the left side of the III-N layers 230, 240 was not etched or was minimally etched, as it is desired, in this example embodiment, to retain polarization layer 240 between the source region and the channel, as will be described in more detail herein.

Figure 5A:
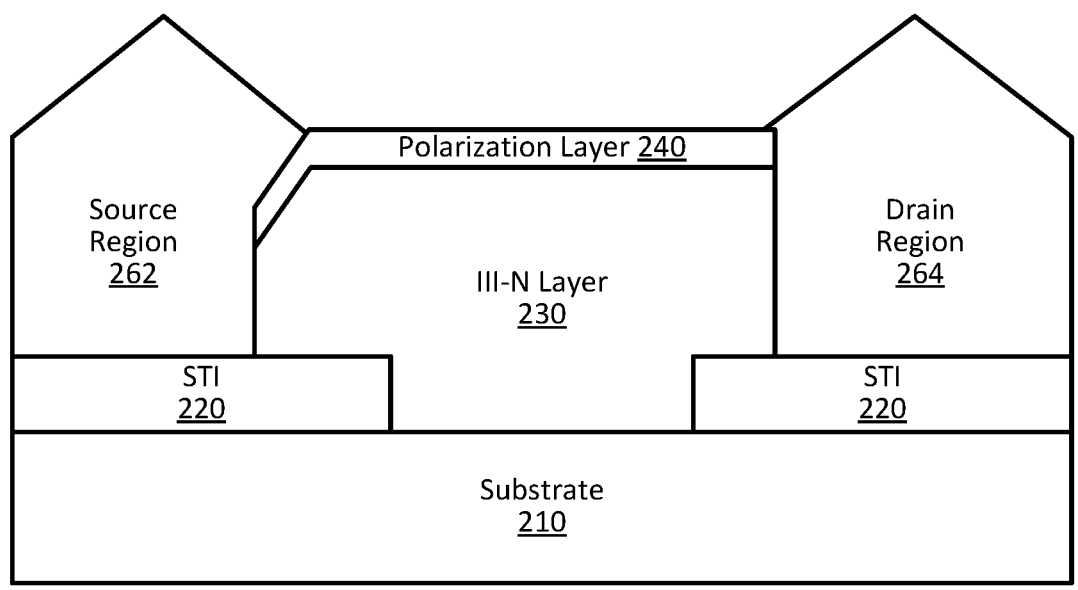
Figure 5B:
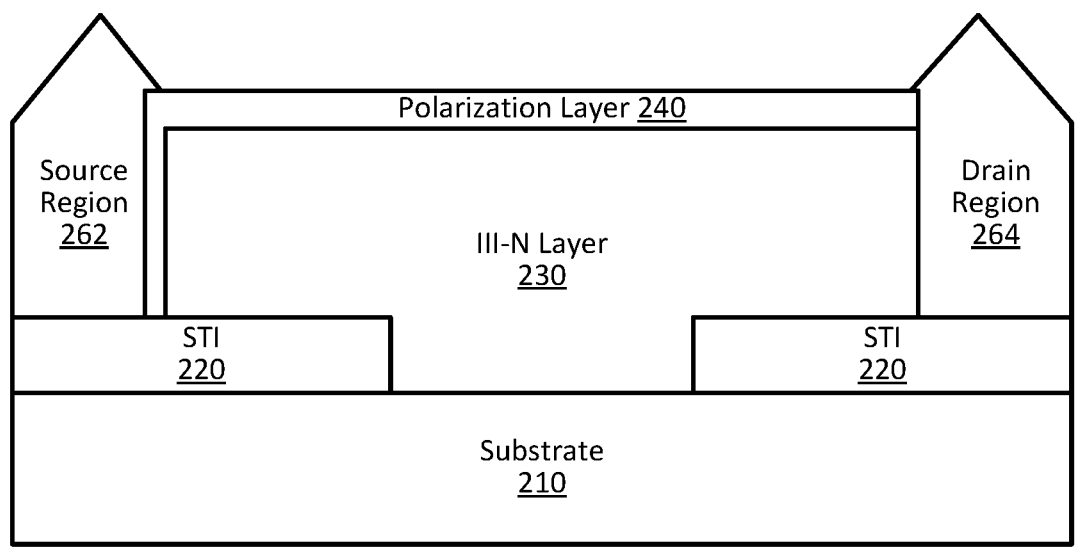

Method 100 of FIG. 1 continues with regrowing 116 source/drain material (or otherwise forming the source/drain regions) in the source/drain trenches 261, 263 of the structures of FIGS. 4A and 4B to form the source region 262 and drain region 264 in the example structures of FIGS. 5A and 5B, respectively, in accordance with some embodiments. The regrowing process 116 may be performed using any suitable techniques, such as depositing/growing/regrowing the source/drain material using any of the aforementioned processes (e.g., MOCVD, MBE, CVD, ALD, PVD), and/or any other suitable process(es) as will be apparent in light of this disclosure. In some embodiments, the source and drain regions 262, 264 may include any suitable material, such as III-N material, and/or any other suitable material(s), as will be apparent in light of this disclosure. In addition, in some embodiments, the source and drain regions 262, 264 may or may not include n-type or p-type dopants, for example. In some embodiments, the source and drain regions 262, 264 may include indium and nitrogen (e.g., InN or InGaN) and be doped in an n-type manner using, e.g., Si and/or Ge, with doping amounts of around 2E20 atoms per cubic cm (or generally in the range of 1E18 to 7E21 atoms per cubic cm), for instance. In some embodiments, one or both of the source and drain regions 262, 264 may have a multilayer structure including multiple material layers. In some embodiments, one or both of the source and drain regions 262, 264 may or may not include grading (e.g., increasing and/or decreasing) the content of one or more materials in at least a portion of one or both of the regions. Note that in the example structures of FIGS. 5A and 5B, the source and drain regions 262, 264 grew above the polarization layer 240, but were not planarized or polished down. However, in some embodiments, one or both of the source and drain regions 262, 264 may be planarized or polished down, as desired.

Figure 6A:
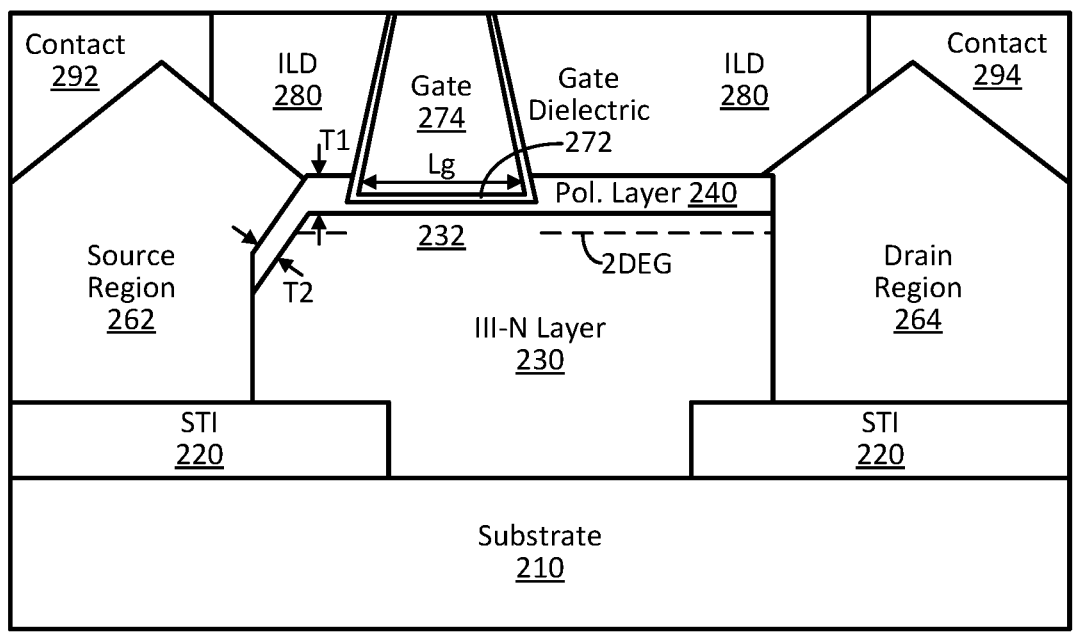
Figure 6B:
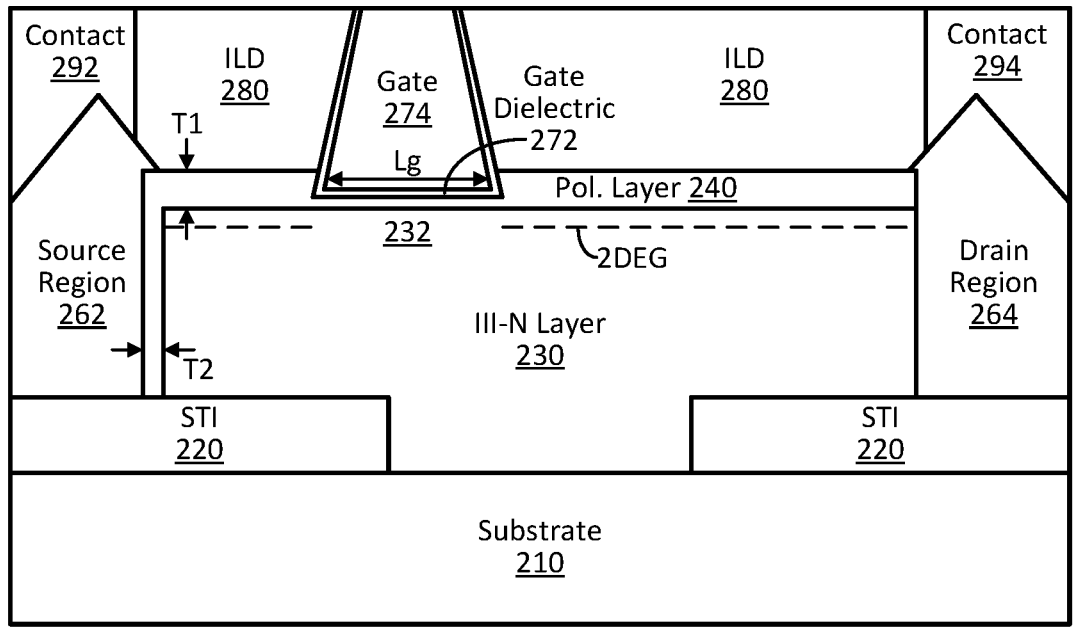

Method 100 of FIG. 1 continues with forming 118 a gate stack over the channel 232 of the III-N transistor and completing 120 formation of the III-N transistor to form the example structures of FIGS. 6A and 6B, in accordance with some embodiments. In these example embodiments, the gate stack includes gate 274 and gate dielectric 272, which were formed by etching a trench in the interlayer dielectric (ILD) 280 layer and depositing the gate dielectric 272 and gate 274 material as shown. In some embodiments, ILD 280 may be formed using any suitable techniques, such as using any of the aforementioned deposition processes (e.g., MBE, CVD, ALD, PVD), and/or any other suitable process(es) as will be apparent in light of this disclosure. In some embodiments, ILD 280 may include any suitable material, such as dielectric material, oxide material (e.g., silicon oxide), and/or nitride material (e.g., silicon nitride), for example. Note that in some embodiments, gate dielectric 272 need not be present and may thus be optional, in some such embodiments. Also note that the ILD 280 on either side of the gate stack may be considered gate sidewall spacers or gate spacers (or simply spacers), as the material 280 helps to electrically insulate or isolate the gate stack from the source/drain regions 262/264 and source/drain contacts 292/294, for example.

Gate 274 and gate dielectric layer 272, in some embodiments, may be formed using any suitable techniques. For instance, the processing of gate dielectric layer 272 and gate 274 may be achieved using any suitable wet and/or dry etch processes, any suitable deposition processes such as those described herein (e.g., MBE, CVD, PVD), any suitable planarization and/or polishing processes, and so forth. In some cases, gate 274 may be referred to as a gate electrode or metal gate (e.g., when gate 274 includes metal or metal alloy material), and generally, gate 274 and gate dielectric layer 272 may be referred to as a gate stack. Although gate dielectric layer 272 is shown located below and adjacent to gate 274, in some embodiments, gate dielectric layer 272 may just be below gate 274 and not adjacent to it, for example. For instance, in FIGS. 7A and 7B, gate dielectric is only below gate 274 and not adjacent to gate 274, as will be described in more detail below. In some embodiments, gate dielectric layer 272 may include silicon dioxide and/or high-k dielectric material, or any other suitable gate dielectric material. Example high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name some examples. In some embodiments, an annealing process may be carried out on the gate dielectric layer 272 to improve its quality when a high-k material is used, for example. In some embodiments, gate 274 may include any suitable material, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, one or more material layers may be formed between the gate dielectric 272 and the gate 274 to, for example, increase the interface quality between the two features and/or to improve the electrical properties between the two features. Such intervening layers may include one or more work-function material layers, for example. In some embodiments, gate dielectric 272 and/or gate 274 may include a multi-layer structure of multiple material layers. In some embodiments, gate dielectric 272 and/or gate 274 may include grading (e.g., increasing and/or decreasing) the content of one or more materials in at least a portion of the feature(s). Numerous gate stack configurations will be apparent in light of this disclosure and the present disclosure is not intended to be limited to any particular configuration unless otherwise stated.

Note that, in the example structures of FIGS. 6A and 6B, the channel or channel region 232 of the III-N transistor may be defined by the gate stack (including gate dielectric layer 272 and gate 274, in these example embodiments), such that the channel 232 is located below the gate stack. As shown in FIGS. 6A and 6B, the gate length Lg (which may closely approximate the channel 232 length), may be in the range of 50 to 150 nm (or generally less than 100 nm) in length, or have any other suitable length as will be apparent in light of this disclosure. As shown in these example structures, when forming the gate stack, a portion of the polarization layer 240 in the gate stack trench location was removed, leaving a thickness of the polarization layer 240 between the gate stack and the channel 232 that is less than thickness T1 (the thickness elsewhere for polarization layer 240 above III-N layer 230), for example. For instance, the thickness of polarization layer 240 between the gate stack and the channel 232 may be in the range of 0.5 to 20 nm (e.g., 1 to 5 nm), or any other suitable thickness as will be apparent in light of this disclosure. In some such embodiments, this thinner portion of the polarization layer 240 under the gate stack may act as an intermediary layer between the gate dielectric 272 and the channel 232, while the remainder of the polarization layer 240 above the III-N layer 230 may be used to form a two-dimensional electron gas (2DEG) configuration (indicated with dashed lines near the top of III-N layer 230). As can be understood based on this disclosure, a 2DEG configuration includes a gas of electrons free to move in two dimensions but tightly confined in the third. Such a tight confinement can lead to quantized energy levels for motion in the third. Such 2DEG configurations may be used as access regions to the left and right of the transistor channel 232, for example. As can be understood based on this disclosure, the example structures shown in FIGS. 6A and 6B can be used for enhancement mode transistors, due to the lack of a 2DEG configuration under the gate stack when the transistor is in an off-state (e.g., the transistors operate with zero (or near zero) gate-source voltage when the transistor is in an off-state), for example.

In some embodiments, the length between the gate and the source (Lgs) and the length between the gate and the drain (Lgd) (dimensions in the X direction) may be the same (or approximately the same) or the lengths may be different, such as is shown in FIGS. 6A and 6B. Accordingly, the 2DEG formed as a result of the heterojunction between polarization layer 240 and III-N layer 230 may have the same length (dimension in the X direction) on either side of the gate or may have different lengths. The gate-source spacing Lgs may be different than the gate-drain spacing Lgd, in some embodiments, depending on the desired breakdown voltage of the III-N device. In some embodiments, Lgs may be less than Lgd, such that Lgd is at least 10, 20, 30, 40, 50, 60, 70, 80, 90, or 100 nm greater than Lgs, or some other suitable threshold difference as will be apparent in light of this disclosure. In some embodiments, Lgs may be in the range of 10 to 50 nm (e.g., 20 to 40 nm), or some other suitable length or length range as will be apparent in light of this disclosure. In some embodiments, Lgd may be in the range of 50 to 200 nm (e.g., 80 to 150 nm), or some other suitable length or length range as will be apparent in light of this disclosure. In some such embodiments, Lgs and Lgd may be selected to control the breakdown voltage, thereby making such a characteristic tunable, for example.

As shown in the example structure of FIGS. 6A and 6B, polarization layer 240 includes thickness T1 above III-N layer 230 in locations that are not under the gate stack and thickness T2 in locations between the source region 262 and the III-N layer 230. In some embodiments, thickness T1 may include a thickness in the range of 0.5 to 100 nm (e.g., 1 to 20 nm), or any other suitable thickness or thickness range as will be apparent in light of this disclosure. In some embodiments, thickness T2 may include a thickness in the range of 0.5 to 20 nm (e.g., 1 to 5 nm), or any other suitable thickness or thickness range as will be apparent in light of this disclosure. Note that in some embodiments, thickness T2 may be selected to be relatively low, as increased thicknesses for T2 (increased thicknesses of the layer between source 262 and III-N layer 230) may increase ohmic contact resistance, for example. In some embodiments, the ratio of the thicknesses T1:T2 may be at least (or approximately) in the range of 1.5 to 15 (e.g., approximately 10), or some other suitable ratio as will be apparent in light of this disclosure. In some embodiments, such a discrepancy between thickness T1 and thickness T2 may be a result of the formation of the polarization layer 240, where T1 is the thickness of the portion formed on the top of the III-N layer 230 and T2 is the thickness of the portion formed on an angled portion or the side of the III-N layer 230. In some embodiments, additional processing may be performed to cause a discrepancy between thicknesses T1 and T2.

Note that although the source to channel heterostructure design is achieved in these example embodiments by using a portion of polarization layer 240, such as is shown in FIGS. 6A and 6B, the present disclosure is not intended to be so limited. For example, in some embodiments, the layer between the source 262 and III-N layer 230 (and thus between the source 262 and channel 232) may be a distinct layer separate from the polarization layer 240, for instance. In some such embodiments, the layer between the source 262 and III-N layer 230/channel 232 may have a thickness T2 as described above, for example. Further, in some such embodiments, the layer between the source 262 and III-N layer 230/channel 232 may include III-N material that has a larger bandgap or energy gap than the material of III-N layer 230, for example. For instance, in an example embodiment, if III-N layer 230 includes GaN, then the layer between the source 262 and the III-N layer may include a III-N material including aluminum (e.g., AlGaN or AlInN). Further note that the layer between the source 262 and the III-N layer 230/channel 232, whether it is a portion of polarization layer 240 or not, may partially between source 262 and III-N layer 230 (e.g., such as in the case of FIG. 6A) or may be completely between source 262 and III-N layer 230 (e.g., such as in the case of FIG. 6B). Numerous variations on the source to channel heterostructure design will be apparent in light of this disclosure.

As is also shown in the example structures of FIGS. 6A and 6B, source and drain contacts 292, 294 were formed. In some embodiments, processing of the contacts 292, 294 may be achieved using any suitable wet and/or dry etch processes (e.g., to form contact trenches in ILD layer 280), any suitable deposition processes such as those described herein (e.g., MBE, CVD, PVD), any suitable planarization and/or polishing processes, and so forth. As shown, contact 292 makes contact to source region 262 and contact 294 makes contact to drain region 264, in these example embodiments. In some embodiments, contacts 292, 294 may include any suitable material, such as a conductive metal or alloy (e.g., aluminum, tungsten, silver, nickel-platinum, or nickel-aluminum). In some embodiments, contacts 292, 294 may include a resistance reducing metal and a contact plug metal, or just a contact plug, depending on the end use or target application. Example contact resistance reducing metals include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the source/drain contact regions, such as adhesion layers (e.g., titanium nitride) and/or liner or barrier layers (e.g., tantalum nitride), if so desired. Note that, in some embodiments, gate stack processing (including forming gate dielectric layer 272 and gate 274, in these example embodiments) may be performed prior to the formation of source/drain regions 262/264 and/or contacts 292/294, while in some embodiments, gate stack processing may be performed after the formation of source/drain regions 262/264 and/or contacts 292/294, for example. Additional processing may be performed to complete formation 120 of the III-N transistor, such as one or more back-end-of-line (BEOL) processes (e.g., forming metallization layers and interconnects), as can be understood based on this disclosure.

Figure 7A:
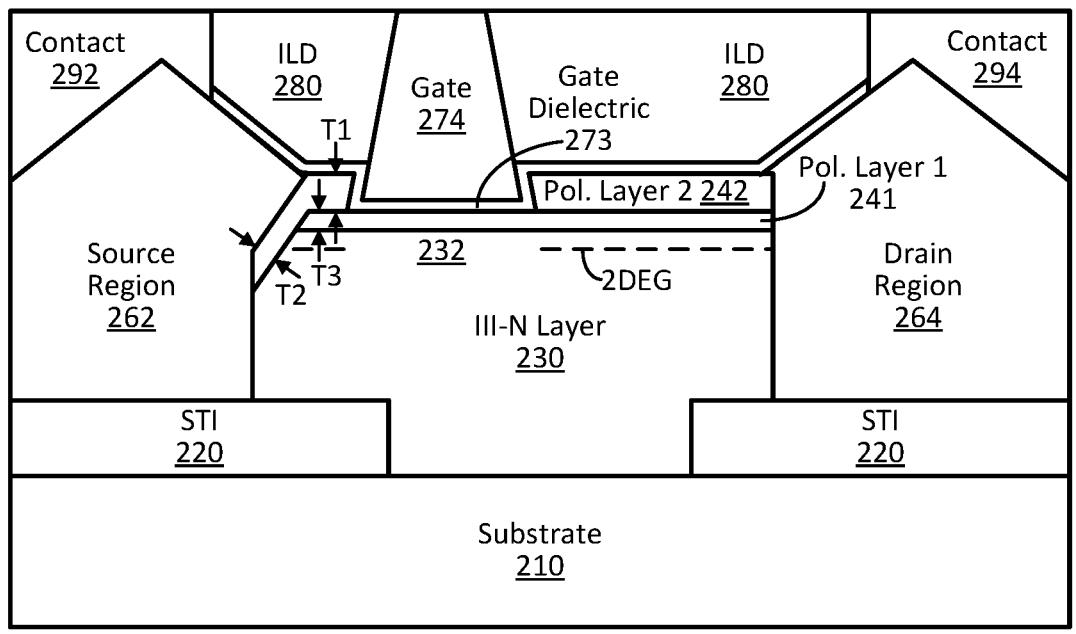
FIGS. 7A and 7B illustrate the example structures of FIGS. 6A and 6B, respectively, including multiple variations, in accordance with some embodiments of the present disclosure.
Figure 7B:
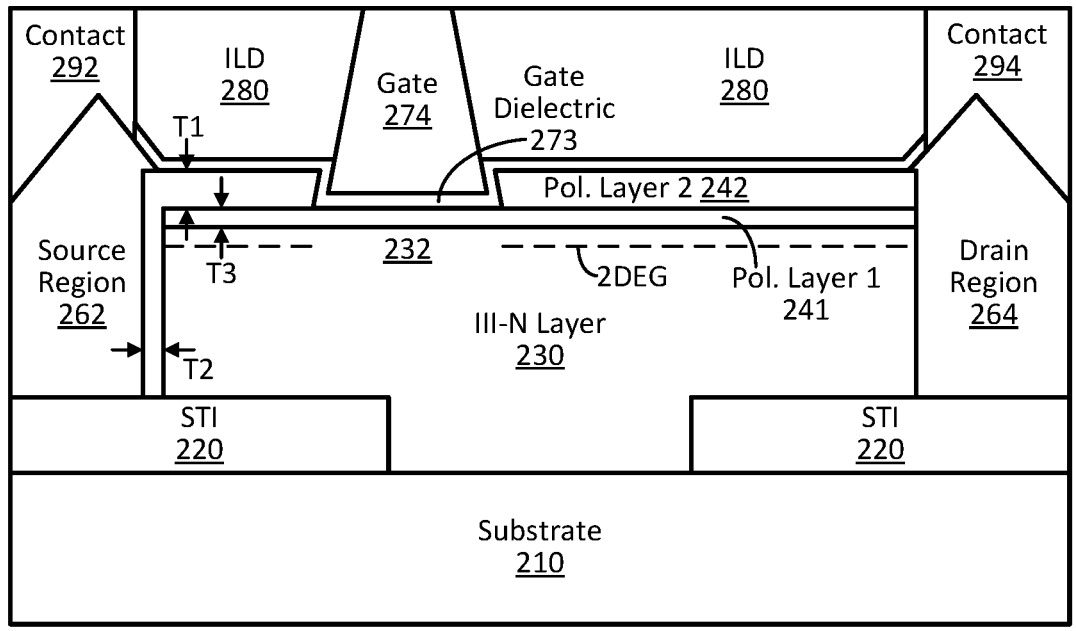

FIGS. 7A and 7B illustrate the example structures of FIGS. 6A and 6B, respectively, including multiple variations, in accordance with some embodiments of the present disclosure. The primary variations between the two sets of structures is that the example structures of FIGS. 7A and 7B include a gate dielectric layer 273 that was blanket deposited prior to the formation of ILD layer 280 and they also include a multilayer polarization layer (including polarization layer 1 241 and polarization layer 2 242), as shown. Note that these and any other variations described in the present disclosure may be individually implemented or implemented in some combination, for example. The previous relevant description with respect to FIGS. 1, 2-6A, and 2-6B is equally applicable to the example structures of FIGS. 7A and 7B. As shown in FIGS. 7A-B, the gate dielectric layer 273 was blanket deposited on the structures of FIGS. 5A-B, respectively, such that the gate dielectric layer 273 was formed prior to the deposition of ILD layer 280 and is thus located below that layer 280. As is also shown, gate dielectric layer 273 is conformally formed, such that it tracks the topography of the underlying structure and is partially formed on source and drain regions 262, 264 (e.g., where contacts 292, 294 are not present). Accordingly, in some embodiments, the gate dielectric layer may only be formed/located in the gate stack location (e.g., as is the case of gate dielectric layer 272 in FIGS. 6A-B), while in some embodiments, the gate dielectric layer may also be formed/located elsewhere (e.g., as is the case of gate dielectric layer 273 in FIGS. 7A-B). In any such case, the gate dielectric may be formed between the gate 274 and the channel 232, may or may not include a multilayer structure, and may include high-k dielectric material(s), for example.

As previously described, another primary variation between the example structures of FIGS. 6A-B and the example structures of FIGS. 7A-B is the polarization charge inducing layer configuration. In the example embodiments of FIGS. 7A and 7B, the polarization charge inducing layer is a multilayer structure, including a first polarization charge inducing layer 241 (also referred to as polarization layer 1) and a second polarization charge inducing layer 242 (also referred to as polarization layer 2), as shown. In some embodiments, the polarization layers 241, 242 may include III-N material and may also be formed using any suitable techniques. Note that polarization layer 1 241 is only formed on the top of III-N layer 230 in these example embodiments; however, the present disclosure is not intended to be so limited. Also note that in these example embodiments, the gate stack trench used to form the gate stack etched through polarization layer 2 242, such that the gate stack makes contact with polarization layer 1 241 as shown. This may be achieved by etching polarization layer 2 242 at the gate stack trench location prior to gate stack processing (e.g., prior to depositing gate dielectric layer 272), for instance. Accordingly, polarization layer 1 241 may act as an intermediary layer between the gate stack (e.g., gate dielectric layer 272) and the transistor channel 232, while polarization layer 2 242 may be used to form 2DEG in the access regions to the left and right of the transistor channel, for example. Note that polarization layer 1 241 may also assist in forming the 2DEG configurations, as that layer 241 is also present in those locations. In an example embodiment, polarization layer 1 241 may include AlN or $Al_xGa_{1-x}N$ (e.g., where $0<x\leq0.5$) and polarization layer 2 242 may include $Al_yIn_{1-y}N$ (e.g., where $0.7\leq y<1$), $Al_zGa_{1-z}N$ (e.g., where $0<z\leq0.5$), or $Al_pIn_qGa_{1-p-q}N$ (e.g., where $0<p\leq0.5$ and $0<q\leq0.5$). As can be understood based on this disclosure, such a multilayer polarization layer configuration can be used to form an enhancement mode transistor. The previously described thicknesses T1 and T2 are equally applicable to the portions shown in FIGS. 7A and 7B. In some embodiments, the thickness T3 of polarization layer 1 241 may be in the range of 0.5 to 20 nm (e.g., 1 to 5 nm), or some other suitable thickness or thickness range as will be apparent in light of this disclosure. Numerous variations and configurations will be apparent in light of the present disclosure.

Example Band Diagram and Benefits

FIG. 8 illustrates an example band diagram 800 for a III-N transistor including a source to channel heterostructure design, in accordance with an embodiment of the present disclosure. In some embodiments, the source to channel heterostructure design (e.g., the inclusion of polarization layer 240 between the source 262 and channel 232 in the example structures of FIGS. 6A and 6B) enables electrons to have high-injection velocities from the source into the channel. In other words, by using heterostructure band engineering, a notch in the conduction band can be engineered between the source and the channel of a III-N transistor. For instance, in the example band diagram 800 in FIG. 8, the Y-axis represents energy level (E) and the X-axis represents position (x). As shown, going from left to right on the X-axis, representative conduction band edge (Ec) and valence band edge (Ev) energy levels are respectively provided for the source, channel, and drain regions of the III-N transistor including a source to channel heterostructure design. As is also shown, the notch in the conduction band edge is indicated as delta Ec. The notch of delta Ec (which may also be referred to as a band offset) results in electrons being injected over a barrier due to thermionic emission with relatively higher velocity than if the source to channel heterostructure design was not used. This occurrence is illustrated by a rightward facing arrow with an electron symbol (e−) in FIG. 8, showing the electron movement from the source region to the channel region. In some instances, the high-velocity electrons may be called hot electrons and their velocity may be approximately proportional to the increase in delta Ec, for example. Once the hot electrons enter the channel region, they are swept down by the drain field with the high velocity. An indicator of transistor performance for high-frequency applications—the unity current gain cut-off frequency (fT)—can be alternatively expressed as ½pi*t, where t is the time it takes for the electron to transit the channel. By injecting electrons with high velocity into the channel, the transit time is reduced and thus a relatively higher fT (and fMAX) can be achieved. In other words, the source to channel heterostructure design can increase the high frequency performance of the transistor, as the high electron velocity enables a lower transit time and hence a faster frequency performance, for example. Therefore, in some embodiments, the techniques described herein can enable III-N transistors to operate at relatively improved fT, such as greater than 300, 350, 400, or 450 GHz fT, for example. Numerous other benefits of the techniques and structures variously described herein will be apparent in light of this disclosure.

Example System

Figure 9:
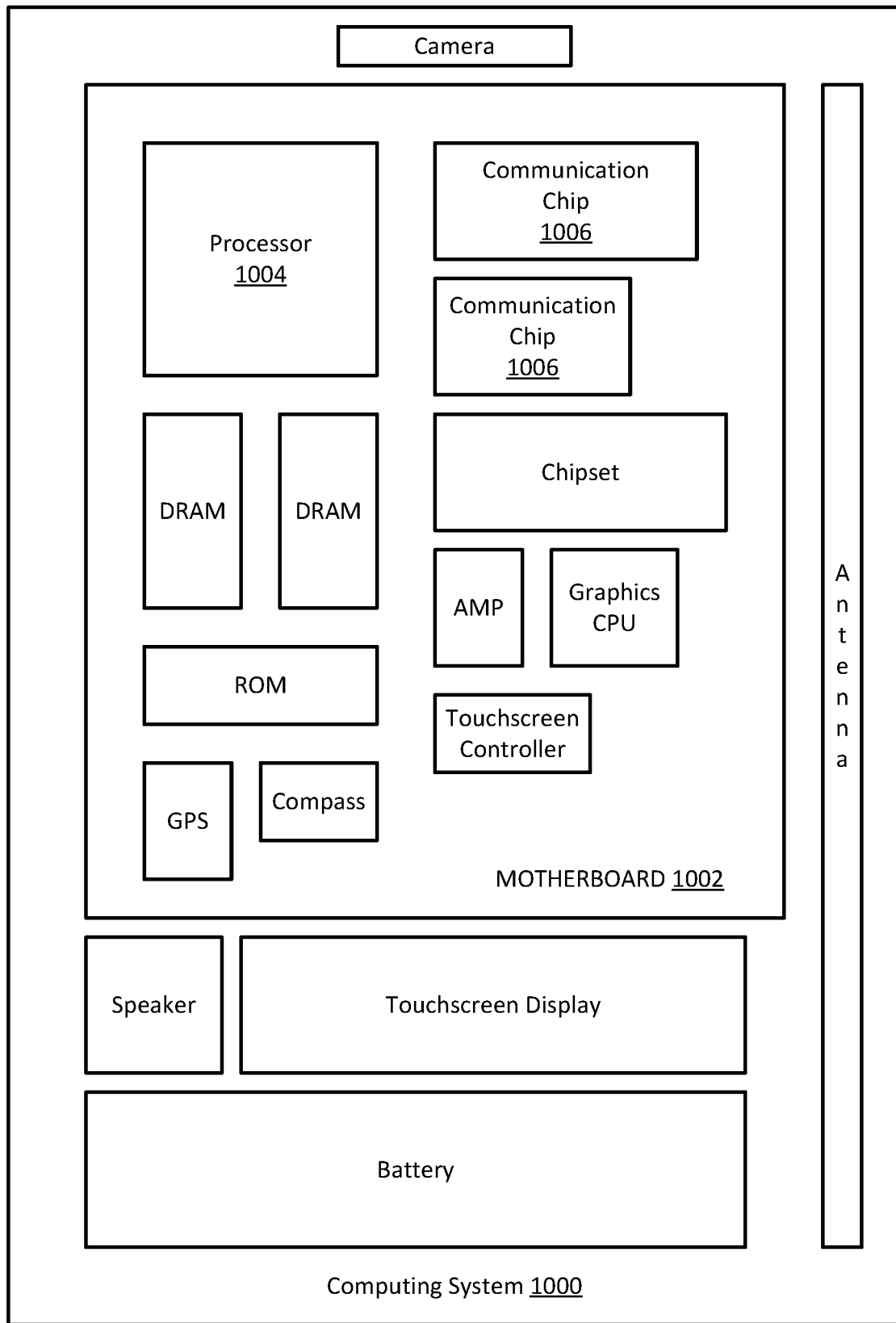
FIG. 9 illustrates an example computing system implemented with the integrated circuit structures and/or techniques provided herein, in accordance with some embodiments of the present disclosure.

FIG. 9 illustrates an example computing system 1000 implemented with the integrated circuit structures and/or techniques provided herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may be implemented with the techniques and/or structures variously described herein, such that the communication chip 1006 includes one or more III-N transistors including a source to drain heterostructure design, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein.

As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a transistor including: a first layer including group III-nitride (III-N) semiconductor material having a first bandgap, the first layer including a channel; at least one polarization charge inducing layer above the first layer; a gate above the channel; source and drain regions adjacent to the channel; and a second layer between the source region and the channel, wherein the second layer includes material having a second bandgap larger than the first bandgap.

Example 2 includes the subject matter of Example 1, wherein the first layer includes gallium nitride (GaN).

Example 3 includes the subject matter of any of Examples 1-2, wherein the at least one polarization charge inducing layer includes a group III-N semiconductor material that includes aluminum.

Example 4 includes the subject matter of any of Examples 1-3, wherein the at least one polarization charge inducing layer has a maximum thickness in the range of 1 to 20 nm.

Example 5 includes the subject matter of any of Examples 1-4, wherein the gate includes one of a metal and a metal alloy.

Example 6 includes the subject matter of any of Examples 1-5, further including a gate dielectric layer between the gate and the channel.

Example 7 includes the subject matter of any of Examples 1-6, wherein the gate is at least 20 nm closer to the source region than the drain region at their respective closest points.

Example 8 includes the subject matter of any of Examples 1-7, wherein the source and drain regions include group III-N semiconductor material.

Example 9 includes the subject matter of any of Examples 1-8, wherein the source and drain regions include n-type impurity dopants.

Example 10 includes the subject matter of any of Examples 1-9, wherein the second layer includes group III-N semiconductor material.

Example 11 includes the subject matter of any of Examples 1-10, wherein the second layer includes at least one of aluminum gallium nitride (AlGaN) and aluminum indium nitride (AlInN).

Example 12 includes the subject matter of any of Examples 1-11, wherein the second layer is a portion of the at least one polarization charge inducing layer.

Example 13 includes the subject matter of any of Examples 1-12, wherein the second layer is between the entirety of the source region and the first layer.

Example 14 includes the subject matter of any of Examples 1-13, wherein the second layer is between only a portion of the source region and the first layer.

Example 15 includes the subject matter of any of Examples 1-14, wherein the second layer has a thickness in the range of 1 to 5 nm between the source region and the channel.

Example 16 is an integrated circuit (IC) including the subject matter of any of Examples 1-15, wherein the transistor is at least one of above and on a substrate that includes silicon (Si).

Example 17 is a computing system including the subject matter of any of Examples 1-16.

Example 18 is a transistor including: a first layer including gallium nitride (GaN), the first layer including a channel; a gate above the channel; a first polarization charge inducing layer between the channel and the gate, wherein the first polarization includes group III-nitride (III-N) semiconductor material that includes aluminum; a second polarization charge inducing layer above the first layer, but absent from below the gate, wherein the second polarization charge inducing layer includes group III-N semiconductor material that includes aluminum; source and drain regions adjacent to the channel, wherein the source and drain regions each include n-type doped group III-N semiconductor material; and wherein a portion of the second polarization charge inducing layer is between the source region and the channel.

Example 19 includes the subject matter of Example 18, wherein the first polarization layer has a thickness between the gate and the channel in the range of 1 to 5 nm.

Example 20 includes the subject matter of any of Examples 18-19, wherein the first polarization layer includes aluminum nitride (AlN).

Example 21 includes the subject matter of any of Examples 18-20, wherein the second polarization layer has a thickness above the first layer in the range of 1 to 20 nm.

Example 22 includes the subject matter of any of Examples 18-21, wherein the second polarization layer includes one of aluminum indium nitride (AlInN), aluminum gallium nitride (AlGaN), and aluminum indium gallium nitride (AlInGaN).

Example 23 includes the subject matter of any of Examples 18-22, wherein the gate includes one of a metal and a metal alloy.

Example 24 includes the subject matter of any of Examples 18-23, further including a gate dielectric layer between the gate and the channel.

Example 25 includes the subject matter of any of Examples 18-24, wherein the gate is at least 20 nm closer to the source region than the drain region at their respective closest points.

Example 26 includes the subject matter of any of Examples 18-25, wherein the portion of the second polarization charge inducing layer is between the source region and the first layer, such that the portion of the second polarization charge layer completely separates the source region and the first layer and such that the source region does not physically contact the first layer.

Example 27 includes the subject matter of any of Examples 18-25, wherein the portion of the second polarization charge inducing layer is between the source region and the first layer, such that the portion of the second polarization charge layer does not completely separate the source region and the first layer and such that the source region physically contacts the first layer.

Example 28 includes the subject matter of any of Examples 18-27, wherein the portion of the second polarization layer between the source region and the channel has a thickness in the range of 1 to 5 nm.

Example 29 is an integrated circuit (IC) including the subject matter of any of Examples 18-28, wherein the transistor is at least one of above and on a substrate that includes silicon (Si).

Example 30 is a computing system including the subject matter of any of Examples 18-29.

Example 31 is a method of forming a transistor, the method including: providing a substrate; forming a first layer at least one of on and above the substrate, the first layer including group III-nitride (III-N) semiconductor material and having a first bandgap; forming at least one polarization charge inducing layer above the first layer, the at least one polarization charge inducing layer including material having a larger bandgap than the first bandgap; forming source and drain regions adjacent to the first layer; and forming a gate above the first layer; wherein a portion of the at least one polarization charge inducing layer is between the source region and the channel.

Example 32 includes the subject matter of Example 31, wherein the substrate includes silicon (Si).

Example 33 includes the subject matter of any of Examples 31-32, wherein the first layer includes gallium nitride (GaN).

Example 34 includes the subject matter of any of Examples 31-33, wherein the at least one polarization charge inducing layer includes a group III-N semiconductor material that includes aluminum.

Example 35 includes the subject matter of any of Examples 31-34, wherein the at least one polarization charge inducing layer has a maximum thickness in the range of 1 to 20 nm.

Example 36 includes the subject matter of any of Examples 31-35, wherein the gate includes one of a metal and a metal alloy.

Example 37 includes the subject matter of any of Examples 31-36, further including forming a gate dielectric layer between the gate and the channel.

Example 38 includes the subject matter of any of Examples 31-37, wherein the gate is at least 20 nm closer to the source region than the drain region at their respective closest points.

Example 39 includes the subject matter of any of Examples 31-38, wherein the source and drain regions include group III-N semiconductor material.

Example 40 includes the subject matter of any of Examples 31-39, wherein the source and drain regions include n-type impurity dopants.

Example 41 includes the subject matter of any of Examples 31-40, wherein the second layer includes group III-N semiconductor material.

Example 42 includes the subject matter of any of Examples 1-14, wherein the portion of the at least one polarization charge inducing layer has a thickness between the source region and the channel in the range of 1 to 5 nm.

The foregoing description of example embodiments has been presented for the purposes of illustration and description. It is not intended to be exhaustive or to limit this disclosure to the precise forms disclosed. Many modifications and variations are possible in light of this disclosure.

It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a first layer including group III-nitride (III-N) semiconductor material having a first bandgap;
   a second layer on and extending along a top surface of the first layer, the second layer compositionally distinct from the first layer;
   a gate above a portion of the first layer;
   a source region adjacent to a first side surface of the first layer;
   a drain region adjacent to a second side surface of the first layer; and
   a third layer between the source region and the first layer, the third layer at least partially on and extending along the first side surface of the first layer, wherein the third layer includes material having a second bandgap larger than the first bandgap, and wherein the first side surface of the first layer is orthogonal to, or otherwise angled with respect to, the top surface of the first layer.

2. The integrated circuit of claim 1, wherein the first layer includes gallium nitride (GaN).

3. The integrated circuit of claim 1, wherein the second layer includes a group III-N semiconductor material that includes aluminum.

4. The integrated circuit of claim 1, wherein the second layer has a maximum thickness in the range of 1 to 20 nm, and the third layer has a thickness in the range of 1 to 5 nm between the source region and the first layer.

5. The integrated circuit of claim 1, further comprising a gate dielectric layer between the gate and the portion of the first layer.

6. The integrated circuit of claim 1, wherein the gate is at least 20 nm closer to the source region than the drain region at their respective closest points.

7. The integrated circuit of claim 1, wherein the source and drain regions include group III-N semiconductor material and n-type impurity dopants.

8. The integrated circuit of claim 1, wherein the second layer and the third layer are distinct layers, and a portion of the third layer is above and on the second layer.

9. The integrated circuit of claim 1, wherein the third layer includes group III-N semiconductor material.

10. The integrated circuit of claim 1, wherein the third layer includes one or both of aluminum gallium nitride (AlGaN) and aluminum indium nitride (AlInN).

11. The integrated circuit of claim 1, wherein the second layer and the third layer are portions of a single layer that extends along both the top surface and the first side surface of the first layer.

12. The integrated circuit of claim 1, wherein the third layer is between the source region and the first layer such that the source region does not directly contact the first layer.

13. The integrated circuit of claim 1, wherein the third layer is between only a portion of the source region and the first layer such that the source region directly contacts the first layer.

14. A computing system comprising the integrated circuit of claim 1.

15. An integrated circuit comprising:
    a first layer including gallium nitride (GaN);
    a gate above a portion of the first layer;
    a second layer on a first surface of the first layer and between the first layer and the gate, wherein the second layer includes group III-nitride (III-N) semiconductor material that includes aluminum;
    a third layer at least partially on a second surface of the first layer, but absent from below the gate, wherein the third layer includes group III-N semiconductor material that includes aluminum; and
    source and drain regions adjacent to the first layer, wherein the source and drain regions each include n-type doped group III-N semiconductor material;
    wherein at least a portion of the third layer that is at least partially on the second surface of the first layer is between the source region and the first layer, and wherein the second surface of the first layer is orthogonal to, or otherwise angled with respect to, the first surface of the first layer.

16. The integrated circuit of claim 15, wherein the second layer has a thickness between the gate and the first layer in the range of 1 to 5 nm.

17. The integrated circuit of claim 15, wherein the second layer includes one of aluminum nitride (AlN) or aluminum gallium nitride (AlGaN), and the third layer includes aluminum, nitrogen and one or both of gallium and indium.

18. The integrated circuit of claim 15, wherein the third layer has a thickness above the first layer in the range of 1 to 20 nm, and wherein the portion of the third layer between the source region and the first layer has a thickness in the range of 1 to 5 nm.

19. An integrated circuit comprising:
    a first layer including a first group III-nitride (III-N) semiconductor material;
    a second layer on and extending along a top surface of the first layer, the second layer including a second group III-N semiconductor material compositionally distinct from the first group III-N semiconductor material;
    a gate above a portion of the first layer;
    a source region adjacent to a first side surface of the first layer and including a third group III-N semiconductor material compositionally distinct from the first and second group III-N semiconductor materials;
    a drain region adjacent to a second side surface of the first layer and including the third group III-N semiconductor material; and
    a third layer between the source region and the first layer, the third layer at least partially on and extending along the first side surface of the first layer;
    wherein the first side surface of the first layer is orthogonal to, or otherwise angled with respect to, the top surface of the first layer.

20. The integrated circuit of claim 19, wherein:
    the second layer and the third layer are distinct layers, and a portion of the third layer is above and on the second layer; or
    the second layer and the third layer are portions of a single layer that extends along both the top surface and the first side surface of the first layer.

* * * * *